US012665422B2

(12) United States Patent      (10) Patent No.:    US 12,665,422 B2

Habib et al.        (45) Date of Patent:     Jun. 23, 2026

(54) DUAL MODE POWER TRANSFER SWITCHES

(71) Applicant: ABB Schweiz AG, Baden (CH)

(72) Inventors: Hany Habib, Glen Allen, VA (US);
Veerakumar Bose, Richmond, VA
(US); Thomas Anthony Kendzia, III,
Richmond, VA (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 18/625,840

(22) Filed: Apr. 3, 2024

(65) Prior Publication Data

US 2025/0316982 A1     Oct. 9, 2025

(51) Int. Cl.
   *H02J 3/007*       (2026.01)
   *H03K 17/687*      (2006.01)

(52) U.S. Cl.
   CPC ............. *H02J 3/007* (2020.01); *H03K 17/687* (2013.01)

(58) Field of Classification Search
None
See application file for complete search history.

(56) References Cited

U.S. PATENT DOCUMENTS

| | | | |
|---|---|---|---|
| 6,330,176 B1 * | 12/2001 | Thrap | H02J 9/06 |
| | | | 363/142 |
| 9,904,641 B2 | 2/2018 | Wang et al. | |
| 11,258,296 B1 | 2/2022 | Bose et al. | |
| 11,444,550 B1 * | 9/2022 | Jelinek | H02J 7/35 |
| 11,682,920 B1 | 6/2023 | Zhang et al. | |
| 12,061,235 B2 * | 8/2024 | Cooper | G01R 31/3278 |
| 2010/0254053 A1 * | 10/2010 | Wilson | H02H 3/207 |
| | | | 361/88 |
| 2017/0126006 A1 * | 5/2017 | Pfitzer | H02J 3/007 |

(Continued)

FOREIGN PATENT DOCUMENTS

| | | |
|---|---|---|
| CN | 117411163 A | 1/2024 |
| EP | 4329148 A1 | 2/2024 |

OTHER PUBLICATIONS

Bose et al., A New Protection Scheme for Static Transfer Switch Using Quasi Resonant Turn-Off Technique. 2023 IEEE Industry Applications Society Annual Meeting (IAS). 2023; 1-25.

(Continued)

*Primary Examiner* — Daniel C Puentes
*Assistant Examiner* — Joel Barnett
(74) *Attorney, Agent, or Firm* — McCarter & English, LLP

(57)           ABSTRACT

In one aspect, a transfer switch configured to operate in different transfer modes is provided. The transfer switch includes first and second inputs, first and second contactors, an output, first and second power stages, and a controller. The first and second inputs are configured to couple with first and second power sources, respectively. The first and second contactors are configured to selectively couple with the first and second inputs, respectively. The output is configured to couple with a load. The first and second power stages are configured to conduct electrical power when active. The controller is configured to determine whether a trigger condition has occurred while the first power stage is active, and in response thereto, to open the first contactor and activate the second power stage to transfer the load from the first power source to the second power source.

16 Claims, 4 Drawing Sheets

(56) References Cited

U.S. PATENT DOCUMENTS

| | | | |
|---|---|---|---|
| 2020/0052525 A1* | 2/2020 | Belletto | H02J 3/007 |
| 2020/0366079 A1* | 11/2020 | Telefus | H02J 13/00022 |
| 2021/0234399 A1* | 7/2021 | Aufderhar | H02J 13/00016 |
| 2022/0247304 A1 | 8/2022 | Oudrhiri et al. | |
| 2024/0186820 A1* | 6/2024 | Chen | H02J 3/007 |

OTHER PUBLICATIONS

Sannino et al., Power quality improvement in an industrial plant with motor load by installing a static transfer switch. 2001 IEEE Industry Applications Conference, 36th IAS Annual Meeting. 2001;782-788.

Tian et al., 400 V/1000 kVA Hybrid Automatic Transfer Switch. IEEE Transactions on Industrial Electronics. Dec. 1, 2013;60(12):5422-5435.

International Search Report and Written Opinion for Application No. PCT/US2025/022552, dated Jul. 18, 2025, 11 pages.

* cited by examiner

DUAL MODE POWER TRANSFER SWITCHES

BACKGROUND

The field of the disclosure relates to power transfer switches, and in particular, to power transfer switches that implement different transfer modes depending on various criteria or trigger conditions.

A transfer switch is a device that is designed to transfer a load from a preferred power source to an alternate power source when the power quality of the preferred power source is deemed unacceptable for the load. An automatic transfer switch (ATS) typically uses contactors to transfer a load, where the contactors are electrically controlled mechanical switches that open one set of power contacts while closing a second set of power contacts. Due to the mechanical nature of the contactors used in in an ATS, an ATS typically requires multiple line cycles to transfer the load from the preferred source to the secondary power source (e.g., fifty to one hundred milliseconds or more).

Static transfer switches (STS) utilize solid-state power stages such as thyristors, silicon carbide (SiC) metal-oxide semiconductor field-effect transistors (MOSFETs), or other types of solid-state devices as the main switching device. Solid-state power stages are capable of transferring a load from the preferred power source to the alternate power source in less than one half line cycle (e.g., less than about eight milliseconds).

Although an STS achieves a much faster transfer time than an ATS, failures in a power stage of the STS can prevent load transfers from the primary power source to the alternate power source under certain conditions. The result is that it may not be possible to transfer the load from the primary power source to the alternate power source if the primary power source fails or is deemed unacceptable for the load, which is undesirable.

Thus, it is desirable to improve the operation and performance of STSs for load transfers when certain conditions arise.

BRIEF DESCRIPTION

In one aspect, a transfer switch configured to operate in different transfer modes is provided. The transfer switch includes first and second inputs, first and second contactors, an output, first and second power stages, and a controller. The first and second inputs are configured to couple with first and second power sources, respectively. The first and second contactors are configured to selectively couple with the first and second inputs, respectively. The output is configured to couple with a load. The first and second power stages are configured to conduct electrical power when active, where the first power stage is configured to selectively couple the first contactor with the output, and where the second power stage is configured to selectively couple the second contactor with the output. The controller is communicatively coupled with the first and second power stages and the first and second contactors. The controller is configured to determine whether a trigger condition has occurred while the first power stage is active, and in response to determining that the trigger condition has occurred, the controller is further configured to open the first contactor and activate the second power stage to transfer the load from the first power source to the second power source.

In another aspect, a method operable by a controller of a transfer switch of operating the transfer switch in different transfer modes is provided. The transfer switch includes first and second inputs, first and second contactors, an output, and first and second power stages. The first and second inputs are coupled with first and second power sources, respectively. The first and second contactors selectively couple with the first and second inputs, respectively. The output is coupled with a load. The first and second power stages conduct electrical power when active, where the first power stage selectively couples the first contactor with the output, and where the second power stage selectively couples the second contactor with the output. The method includes determining whether a trigger condition has occurred while the first power stage is active, and in response to determining that the trigger condition has occurred, opening the first contactor and activating the second power stage to transfer the load from the first power source to the second power source.

In another aspect, a transfer switch configured to alternate between automatic transfer switch (ATS) mode and static transfer switch (STS) mode is provided. The transfer switch includes first and second inputs, first and second contactors, an output, first and second power stages, and a controller. The first and second inputs are configured to couple with first and second power sources, respectively. The first and second contactors are configured to selectively couple with the first and second inputs, respectively. The output is configured to couple with a load. The first and second power stages are configured to conduct electrical power when active, where the first power stage is configured to selectively couple the first contactor with the output, and where the second power stage is configured to selectively couple the second contactor with the output. The controller is communicatively coupled with the first and second power stages and the first and second contactors. The controller is configured to operate the transfer switch in the ATS mode using one of the first and second contactors and one of the first and second power stages to transfer the load between the first and second power sources, and to operate the transfer switch in the STS mode using the first and second power stages to transfer the load between the first and second power sources.

BRIEF DESCRIPTION OF DRAWINGS

These and other features, aspects, and advantages of the present disclosure will become better understood when the following detailed description is read with reference to the accompanying drawings in which like characters represent like parts throughout the drawings.

Figure 1:
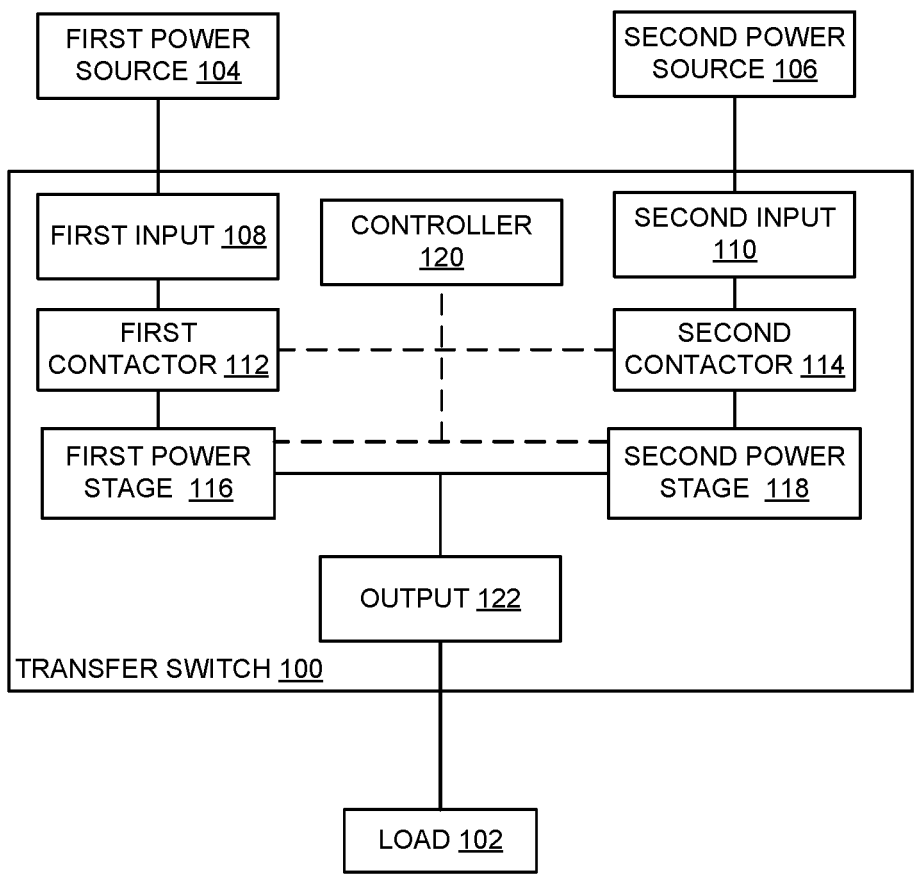
FIG. 1 depicts a simplified block diagram of a transfer switch in an exemplary embodiment.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general-purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are not intended to limit in any way the definition and/or meaning of the term processor and processing device.

As discussed previously, various conditions can arise in STS that may prevent the STS from transferring the load from a preferred power source to an alternate power source when the preferred power source is incapable of supplying electrical power to the load. For example, when power stages are used to transfer the load between power sources, a short in a power stage may prevent the power stage from being deactivated to allow the transfer. It is not possible maintain both power stages active at the same time, as this would result in short circuit path between the two power sources, which may not be synchronized in voltage and frequency. Therefore, a short circuit in one of the power stages may prevent the power transfer from occurring.

In the embodiments described herein, transfer switches are disclosed that utilize both contactors and power stages to operate the transfer switch in different modes. When the transfer switch operates in an STS mode, the transfer switch utilizes the power stages to quickly transfer the load (e.g., within one line cycle) between primary power sources (e.g., preferred power sources) and secondary power sources (e.g., alternate power sources) while the contactors are closed. When the transfer switch operates in an ATS mode, the transfer switch utilizes one of the contactors and one of the power stages to transfer the load between the primary and secondary power sources (e.g., typically within about 50 milliseconds (ms) to about one hundred ms). For example, if a power stage is shorted in the primary power source current path and cannot be disabled, a power transfer can still occur from the primary power source to the secondary power source by opening the contactor in the primary power source current path and activating the alternate power stage in the current path of the secondary power source. Although this ATS mode transfer may take longer than a normal STS mode transfer (e.g., longer than one line cycle), the load is still able to be transferred even though one of the power stages is shorted. The result is more reliable protection of the load from transient faults at the primary power source and/or the active power stage supplying power to the load.

FIG. 1 depicts a simplified circuit diagram of a transfer switch 100 in an exemplary embodiment. In this embodiment, transfer switch 100 selectively supplies a load 102 with electrical power from either a first power source 104 or a second power source 106 depending on various criteria or trigger conditions. For example, transfer switch 100 may supply electrical power to load 102 primarily from first power source 104 unless the electrical power delivered by first power source 104 falls outside of a desired range of values (e.g., first power source 104 has a voltage, and/or frequency, and/or a harmonic distortion that varies from target values by a threshold amount). If, for example, first power source 104 is incapable of supplying electrical power to load 102 (e.g., first power source 104 fails or is incapable of supplying electrical power to load 102 at a desired power quality), then transfer switch 100 switches load 102 from first power source 104 to second power source 106. In this regard, first power source 104 may operate as a preferred power source for load 102, with second power source 106 operating as a backup or alternate power source for load 102.

Although only two power sources for load 102 are depicted in FIG. 1, transfer switch 100 selectively couples load 102 to any number of power sources in other embodiments. Further, although transfer switch 100 is depicted as switching single phase Alternating Current (AC) power in FIG. 1, transfer switch 100 switches 3-phase AC power in other embodiments. In 3-phase AC embodiments, first power source 104 and second power source 106 are 3-phase AC sources, and load 102 is a 3-phase AC load. In other embodiments, first power source 104 and second power source 106 are Direct Current (DC) sources, and load 102 is a DC load. In other embodiments, first power source 104 and second power source 106 are 3-phase AC sources, and transfer switch 100 supplies a plurality of single-phase AC loads (e.g., load 102 is a plurality of single-phase AC loads).

In this embodiment, first power source 104 is electrically coupled to transfer switch 100 at a first input 108 and second power source 106 is electrically coupled to transfer switch 100 at a second input 110. Transfer switch 100 further includes a first contactor 112, a second contactor 114, a first power stage 116, a second power stage 118, a controller 120, and an output 122. Generally, first and second contactors 112, 114 comprise any component, system, or device that provides galvanic isolation between their respective first and second inputs 108, 110 and first and second power stages 116, 118 (e.g., first and second contactors 112, 114 may comprise an electro-mechanical device that provides galvanic isolation via an air gap when opened). First and second contactors 112, 114 may be opened and closed via commands or signals provided by controller 120. Further, first and second contactors 112, 114 may not be externally accessible at transfer switch 100 by an operator in some embodiments, and further still, first and second contactors 112, 114 may not provide overcurrent trip capabilities in some embodiments.

First and second power stages 116, 118 may comprise SiC MOSFETS, thyristors, or other types of solid-state switches, which selectively couple first and second contactors 112, 114 with output 122.

Controller 120 comprises any component, system, or device that performs the functionality described herein for controller 120. Output 122 in this embodiment is coupled to load 102.

In this embodiment, transfer switch 100 is configured to operate in different transfer modes based on various detected trigger conditions. For example, transfer switch 100 may alternate between operating in an STS mode and operating in an ATS mode depending on whether controller 120 detects various criteria, referred to as trigger conditions. During normal operation of transfer switch 100, controller 120 may operate transfer switch 100 in STS mode, switching load 102 between first and second power sources 104, 106 using first and second power stages 116, 118 while first and second contactors 112, 114 remain closed. When a trigger condition is detected by controller 120, controller 120 may operate transfer switch 100 in ATS mode, switching load between first and second power sources 104, 106 by opening one of first and second contactors 112, 114 and activating one of first and second power stages 116, 118.

During normal operation, first power source 104 is the preferred power source for load 102 and second power source 106 is the backup or alternate power source for load 102. First and second contactors 112, 114 are closed, first power stage 116 is active (e.g., first power stage 116 conducts current) and second power stage 118 is inactive (e.g., second power stage 118 does not conduct current).

If controller 120 determines that first power source 104 is not capable of supplying electrical power to load 102 (e.g., due to power loss at first power source 104 or a power quality issue at first power source 104), then controller 120 operates transfer switch 100 in STS mode to quickly transfer load 102 (e.g., within one line cycle) from first power source

104 to second power source 106 by activating second power stage 118 and deactivating first power stage 116 (e.g., using a load transfer process).

However, various trigger conditions may arise at transfer switch 100 which may prompt controller 120 to switch transfer switch 100 from STS mode to ATS mode and transfer load 102 from first power source 104 to second power source 106 using first and/or second contactors 112, 114. When these trigger conditions occur, controller 120 operates transfer switch 100 in ATS mode to transfer load 102 from first power source 104 to second power source 106 using first contactor 112 and second power stage 118. To do so, controller 120 opens first contactor 112 and activates second power stage 118, which transfers load 102 from first power source 104 to second power source 106. The result is that load 102 is transferred, albeit slower (e.g., within more than one line cycle) than when using STS mode, to second power source 106.

If controller 120 detects that these trigger conditions are resolved, then controller 120 may operate transfer switch 100 in STS mode to transfer load 102 from second power source 106 to first power source 104. To do so, controller 120 closes first contactor 112, deactivates second power stage 118, and activates first power stage 116 using a load transfer process, which transfers load 102 from second power source 106 to first power source 104.

One example of detecting a trigger condition includes determining, by controller 120, that the power quality of first power source 104 is outside of a pre-defined range (e.g., a voltage, and/or a frequency, and/or harmonic distortion of first power source 104 is outside of a pre-defined range). If controller 120 determines that the power quality of first power source 104 is outside of a pre-defined range, then controller 120 may operate transfer switch 100 in ATS mode as described above to transfer load 102 from first power source 104 to second power source 106 by opening first contactor 112 and activating second power stage 118. This may be used, for example to prevent damage to first power stage 116 from first power source 104 by opening first contactor 112. Similar to discussed above, if controller 120 detects that the power quality of first power source 104 has improved such that the power quality is now within the predefined range, then controller 120 may operate transfer switch 100 in STS mode as described above to transfer load 102 from second power source 106 to first power source by closing first contactor 112, deactivating second power stage 118, and activating first power stage 116 using a load transfer process, which transfers load 102 from second power source 106 to first power source 104.

Another example of detecting a trigger condition includes determining, by controller 120, that first power stage 116 is incapable of being deactivated. For example, first power stage 116 may be non-responsive, partially damaged, or electrically shorted in an active state of electrical conduction. If controller 120 determines that first power stage is incapable of being deactivated or electrically shorted, then controller 120 may operate transfer switch 100 in ATS mode as described above to transfer load 102 from first power source 104 to second power source 106 by opening first contactor 112 and activating second power stage 118. Similar to discussed above, if controller 120 detects that the issues at first power stage 116 are resolved (e.g., first power stage 116 is now capable of being deactivated and/or is no longer electrically shorted), then controller 120 may operate transfer switch 100 in STS mode as described above to transfer load 102 from second power source 106 to first power source by closing first contactor 112, deactivating second power stage 118, and activating first power stage 116 using a load transfer process, which transfers load 102 from second power source 106 to first power source 104.

Although first power source 104 has been describe as the primary power source and second power source 106 has been described as the secondary power source for load 102, the opposite is also possible with second power source 106 normally powering load 102 with first power source 104 as the backup or alternate power source. The result of this is that operations described above for the first and second power sources 104, 106, the first and second contactors 112, 114, and first and second power stages 116, 118 are reversed.

Figure 2:
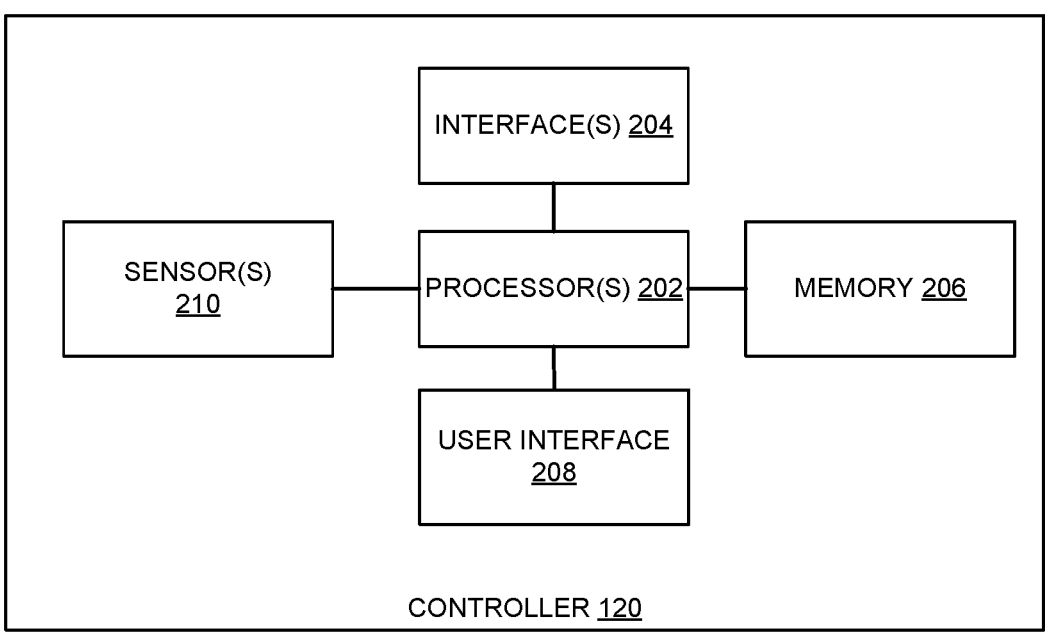
FIG. 2 depicts a block diagram of a controller of the transfer switch of FIG. 1 in an exemplary embodiment.

FIG. 2 depicts a block diagram of controller 120 in an exemplary embodiment. Controller 120 will be described with respect to various discrete elements, which perform functions. These elements may be combined in different embodiments or segmented into different discrete elements in other embodiments. In this embodiment, controller 120 comprises at least one processor 202, at least one interface 204, at least one memory 206, a user interface 208, and at least one sensor 210. In some embodiments, memory 206 stores programmable instructions that control the operation of processor 202 in order to implement the functionality described herein for controller 120. In some embodiments, controller 120 comprises a different configuration of components, and therefore, the discussion of controller 120 is not limited to the specific configuration and arrangement depicted in FIG. 2.

Interface 204 may comprise wired interfaces, wireless interfaces, and combinations thereof. Interface 204 may be used by controller 120 to communicate with the various components of FIG. 1, such as first and second contactors 112, 114 and first and second power stages 116, 118 in order to control to control their operation and/or in order to determine their open/inactive and closed/active states. User interface 208 may comprise keypads, display devices, trackball devices, mice, buttons, and the like, which enable an operator to interact with transfer switch 100. Sensors 210 comprise any voltage sensor, current sensor, frequency sensor, other types of sensors, and combinations thereof. Sensors 210 may be used by controller 120 to determine the operating states (e.g., open/inactive or closed/active) of the various switching components of FIG. 1, such as first and second contactors 112, 114 and first and second power stages 116, 118. Sensors 210 may also be used to evaluate the operation and/or the power quality at first and second power sources 104, 106, measure various electrical parameters at first and second inputs 108, 110, output 122, determine the health of first and second power stages 116, 118, determine whether first and second power stages 116, 118 are electrically shorted, determine whether first and second power stages 116, 118 are no longer electrically shorted, etc.

Figure 3:
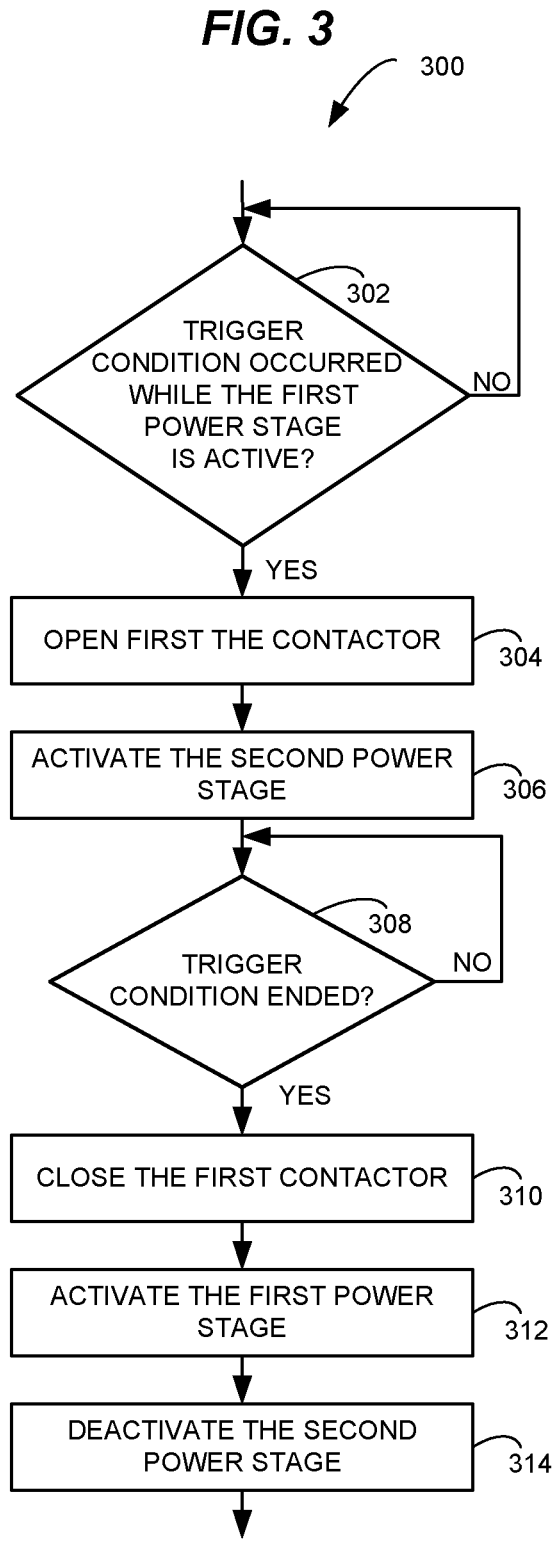
FIG. 3 depicts a flow chart of a method operable by a controller of a transfer switch for operating the transfer switch in different transfer modes in an exemplary embodiment.

FIG. 3 depicts a flow chart of a method 300 operable by a controller of a transfer switch of operating the transfer switch in different modes in an exemplary embodiment. Method 300 will be discussed with respect to transfer switch 100 of FIGS. 1 and 2, although method 300 may apply to other configurations of transfer switches, not shown.

Method 300 comprises determining 302, by the controller, whether a trigger condition has occurred while the first power stage is active, and the first power source is powering the load. For example, processor 202 of controller 120 determines whether a trigger condition has occurred while first power stage 116 is active and first power source 104 is powering load 102 (see FIGS. 1 and 2). To do so, processor 202 may utilize sensors 210 and/or interfaces 204 to determine whether the trigger condition has occurred. As discussed above, the trigger condition may include determining, by processor 202, that first power stage 116 is incapable of being deactivated, determining, by processor 202, that first power stage 116 is electrically shorted in an active state of electrical conduction, determining, by processor 202, that the power quality of first power source 104 is outside of a pre-defined range (e.g., outside of a predefined voltage, and/or a pre-defined frequency, and/or a pre-defined harmonic distortion, etc.).

If the trigger condition has occurred, then method 300 further comprises opening 304 the first contactor and activating 306 the second power stage to transfer the load from the first power source to the second power source. For example, processor 202 of controller 120 opens first contactor 112 and activates second power stage 118 (see FIGS. 1 and 2).

Method 300 further comprises determining 308, by the controller, whether the trigger condition has ended. For example, processor 202 of controller 120 determines whether a trigger condition has ended utilizing sensors 210 and/or interfaces 204. As discussed above, determining that the trigger condition has ended may include determining, by processor 202, that first power stage 116 is now capable of being deactivated, determining, by processor 202, that first power stage 116 is no longer electrically shorted in an active state of electrical conduction, determining, by processor 202, that the power quality of first power source 104 is within of a pre-defined range (e.g., within of a predefined voltage, and/or a pre-defined frequency, and/or a pre-defined harmonic distortion, etc.).

If the trigger condition has ended, then method 300 further comprises closing 310 the first contactor, activating 312 the first power stage, and deactivating 314 the second power stage to transfer the load from the second power source to the first power source. For example, processor 202 of controller 120 closes first contactor 112, activates first power stage 116, and deactivates second power stage 118 (see FIGS. 1 and 2).

Figure 4:
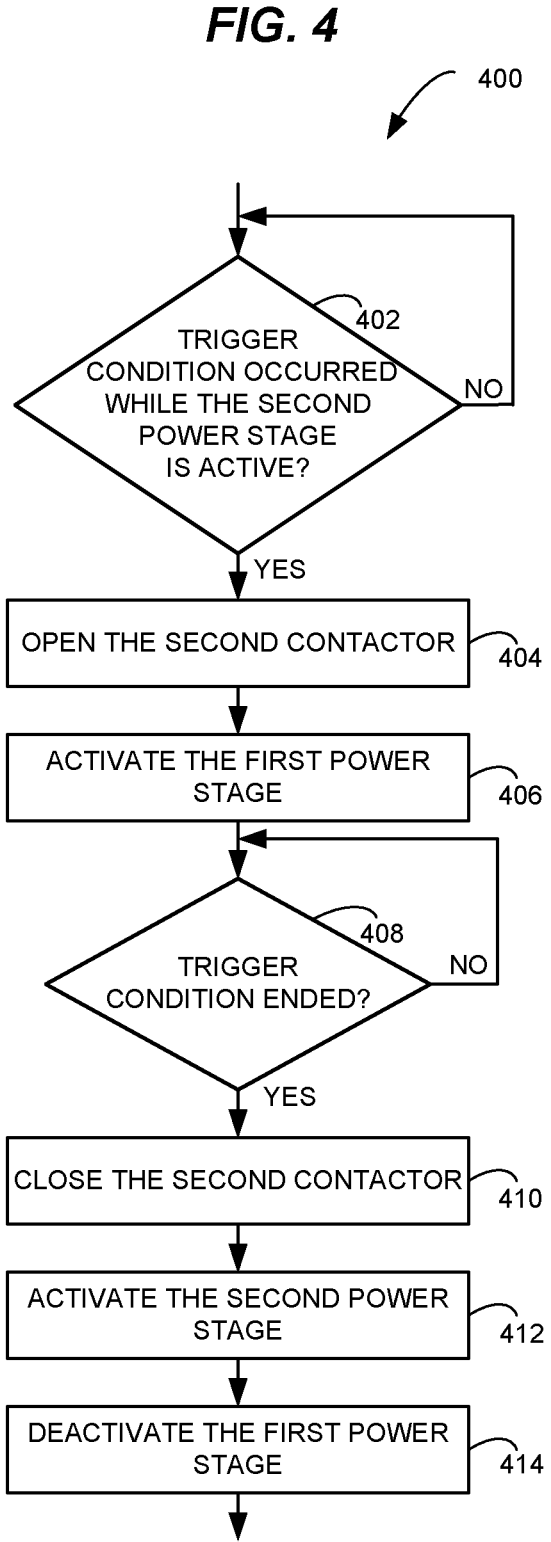
FIG. 4 depicts a flow chart of another method operable by a controller of a transfer switch for operating the transfer switch in different transfer modes in an exemplary embodiment.

FIG. 4 depicts another flow chart of another method 400 operable by a controller of a transfer switch of operating the transfer switch in different modes in an exemplary embodiment. Method 400 will be discussed with respect to transfer switch 100 of FIGS. 1 and 2, although method 400 may apply to other configurations of transfer switches, not shown.

Method 400 comprises determining 402, by the controller, whether a trigger condition has occurred while the second power stage is active and the second power source is powering the load. For example, processor 202 of controller 120 determines whether a trigger condition has occurred while second power stage 118 is active and second power source 106 is powering load 102 (see FIGS. 1 and 2) utilizing sensors 210 and/or interfaces 204. As discussed above, the trigger condition may include determining, by processor 202, that second power stage 118 is incapable of being deactivated, determining, by processor 202, that second power stage 118 is electrically shorted in an active state of electrical conduction, determining, by processor 202, that the power quality of second power source 106 is outside of a pre-defined range (e.g., outside of a predefined voltage, pre-defined frequency, and/or a pre-defined harmonic distortion, etc.).

If the trigger condition has occurred, then method 400 further comprises opening 404 the second contactor and activating 406 the first power stage to transfer the load from the second power source to the first power source. For example, processor 202 of controller 120 opens second contactor 114 and activates first power stage 116 (see FIGS. 1 and 2).

Method 400 further comprises determining 408, by the controller, whether the trigger condition has ended. For example, processor 202 of controller 120 determines whether a trigger condition has ended utilizing sensors 210 and/or interfaces 204. As discussed above, determining that the trigger condition has ended may include determining, by processor 202, that second power stage 118 is now capable of being deactivated, determining, by processor 202, that second power stage 118 is no longer electrically shorted in an active state of electrical conduction, determining, by processor 202, that the power quality of second power source 106 is now within the pre-defined range (e.g., within the predefined voltage, and/or the pre-defined frequency, and/or the pre-defined harmonic distortion, etc.).

If the trigger condition has ended, then method 400 further comprises closing 410 the second contactor, activating 412 the second power stage, and deactivating 414 the first power stage to transfer the load from the first power source to the second power source. For example, processor 202 of controller 120 closes second contactor 114, activates second power stage 118, and deactivates first power stage 116 (see FIGS. 1 and 2).

An example technical effect of the apparatus and method described herein includes one or more of: (a) minimizing disruptions to a load by alternating a transfer switch between STS and ATS mode depending on detected triggers; and (b) eliminating failure modes in a typical STS using contactors to transfer the load between power sources during transient faults at the power sources and/or the power stages of the transfer switch.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A transfer switch configured to operate in different transfer modes, the transfer switch comprising:

first and second inputs configured to couple with first and second power sources, respectively;

first and second contactors configured to selectively couple with the first and second inputs, respectively, wherein the first and second contactors comprise electro-mechanical devices configured to provide galvanic isolation via an air gap when opened;

an output configured to couple with a load;

first and second solid-state power stages configured to conduct electrical power when active, and to block the electrical power when inactive, wherein the first solid-state power stage is configured to selectively couple the first contactor with the output, and wherein the second solid-state power stage is configured to selectively couple the second contactor with the output;

a controller communicatively coupled with the first and second solid-state power stages and the first and second contactors, wherein the controller is configured to:

determine whether the first solid-state power stage is electrically shorted in a state of electrical conduction and incapable of being deactivated while the first solid-state power stage is active, the first power source is powering the load, and the second solid-state power stage is inactive; and in response to determining that the first solid-state power stage is electrically shorted in the state of electrical conduction and incapable of being deactivated, the controller is further configured to:

open the first contactor; and activate the second solid-state power stage to transfer the load from the first power source to the second power source.

2. The transfer switch of claim 1, wherein the controller is further configured to open the first contactor and activate the second solid-state power stage in response to determining that the first solid-state power stage is electrically shorted in the state of electrical conduction and incapable of being deactivated and that a power quality of the first power source is outside of a pre-defined range.

3. The transfer switch of claim 2, wherein the power quality comprises at least one of a voltage, a frequency, and a harmonic distortion of the first power source.

4. The transfer switch of claim 1, wherein the first and second solid-state power stages comprise one or more silicon carbide metal-oxide-semiconductor field-effect transistors (SiC MOSFETs) and thyristors.

5. The transfer switch of claim 1, wherein the controller is further configured to:

determine whether the first solid-state power stage is no longer electrically shorted in the state of electrical conduction and is capable of being deactivated while powering the load from the second power source; and in response to determining that the first solid-state power stage is no longer electrically shorted in the state of electrical conduction and is capable of being deactivated, the controller is further configured to:

close the first contactor;

activate the first solid-state power stage; and deactivate the second solid-state power stage to transfer the load from the second power source to the first power source.

6. A method operable by a controller of a transfer switch of operating the transfer switch in different transfer modes, wherein:

the transfer switch comprises:

first and second inputs coupled with first and second power sources, respectively;

first and second contactors selectively coupling with the first and second inputs, respectively, wherein the first and second contactors comprise electro-mechanical devices configured to provide galvanic isolation via an air gap when opened;

an output coupled with a load;

first and second solid-state power stages that conduct electrical power when active, and block the electrical power when inactive, wherein the first solid-state power stage selectively couples the first contactor with the output, and wherein the second solid-state power stage selectively couples the second contactor with the output, and

11 the method comprises:

determining whether the first solid-state power stage is electrically shorted in a state of electrical conduction and incapable of being deactivated while the first solid-state power stage is active, the first power source is powering the load, and the second solid-state power stage is inactive; and in response to determining that the first solid-state power stage is electrically shorted in the state of electrical conduction and incapable of being deactivated, the method further comprises:

opening the first contactor; and activating the second solid-state power stage to transfer the load from the first power source to the second power source.

7. The method of claim 6, wherein the method further comprises:

opening the first contactor and activating the second solid-state power stage to transfer the load from the first power source to the second power source in response to determining that the first solid-state power stage is electrically shorted in the state of electrical conduction and incapable of being deactivated and that a power quality of the first power source is outside of a pre-defined range.

8. The method of claim 7 wherein:

the power quality comprises at least one of a voltage, a frequency, and a harmonic distortion of the first power source.

9. The method of claim 6, wherein:

the first and second solid-state power stages comprise one or more silicon carbide metal-oxide-semiconductor field-effect transistors (SiC MOSFETs) and thyristors.

10. The method of claim 6, further comprising:

determining whether the first solid-state power stage is no longer electrically shorted in the state of electrical conduction and is capable of being deactivated while powering the load from the second power source; and in response to determining that the first solid-state power stage is no longer electrically shorted in the state of electrical conduction and is capable of being deactivated, the method further comprises:

closing the first contactor;

activating the first solid-state power stage; and deactivating the second solid-state power stage to transfer the load from the second power source to the first power source.

11. A transfer switch configured to alternate between automatic transfer switch (ATS) mode and static transfer switch (STS) mode, the transfer switch comprising:

first and second inputs configured to couple with first and second power sources, respectively;

first and second contactors configured to selectively couple with the first and second inputs, respectively, wherein the first and second contactors comprise electro-mechanical devices configured to provide galvanic isolation via an air gap when opened;

an output configured to couple with a load;

first and second solid-state power stages configured to conduct electrical power when active, and to block the electrical power when inactive, wherein the first solid-state power stage is configured to selectively couple the first contactor with the output, and wherein the second solid-state power stage is configured to selectively couple the second contactor with the output;

a controller communicatively coupled with the first and second solid-state power stages and the first and second contactors, wherein the controller is configured to:

operate the transfer switch in the ATS mode by opening one of the first and second contactors and one of the first and second solid-state power stages to transfer the load between the first and second power sources in response to determining that one of the first and second solid-state power stages is electrically shorted in a state of electrical conduction and incapable of being deactivated; and operate the transfer switch in the STS mode using the first and second solid-state power stages to transfer the load between the first and second power sources while the first and second contactors remain closed.

12. The transfer switch of claim 11, wherein the controller is further configured, while the first solid-state power stage is active, to:

operate the transfer switch in the ATS mode to transfer the load from the first power source to the second power source in response to determining that the first solid-state power stage is electrically shorted in a state of electrical conduction and incapable of being deactivated.

13. The transfer switch of claim 12, wherein the controller is further configured, to operate the transfer switch in the ATS mode to transfer the load from the first power source to the second power source, to:

open the first contactor; and activate the second solid-state power stage.

14. The transfer switch of claim 12, wherein the controller is further configured, while the load is powered from the second power source, to:

determine whether the first solid-state power stage is no longer electrically shorted in the state of electrical conduction and is capable of being deactivated; and operate the transfer switch in the STS mode to transfer the load from the second power source to the first power source in response to determining that the first solid-state power stage is no longer electrically shorted in the state of electrical conduction and is capable of being deactivated.

15. The transfer switch of claim 14, wherein the controller is further configured, to operate the transfer switch in the STS mode to transfer the load from the second power source to the first power source, to:

close the first contactor;

activate the first solid-state power stage; and deactivate the second solid-state power stage.

16. The transfer switch of claim 11, wherein the first and second solid-state power stages comprise one or more silicon carbide metal-oxide-semiconductor field-effect transistors (SiC MOSFETs) and thyristors.

* * * * *